(12) United States Patent
Fujimoto et al.

(10) Patent No.: US 11,591,483 B2
(45) Date of Patent: Feb. 28, 2023

(54) AQUEOUS BASED NANOPARTICLE INK

(71) Applicant: BOISE STATE UNIVERSITY, Boise, ID (US)

(72) Inventors: Kiyo Fujimoto, Meridian, ID (US); David Estrada, Boise, ID (US); Harish Subbaraman, Boise, ID (US)

(73) Assignee: Boise State University, Boise, ID (US)

( * ) Notice: Subject to any disclaimer, the term of this patent is extended or adjusted under 35 U.S.C. 154(b) by 267 days.

(21) Appl. No.: 16/930,244

(22) Filed: Jul. 15, 2020

(65) Prior Publication Data

US 2021/0017408 A1    Jan. 21, 2021

Related U.S. Application Data

(60) Provisional application No. 62/874,367, filed on Jul. 15, 2019.

(51) Int. Cl.
| | | |
|---|---|---|
| *C09D 11/037* | (2014.01) | |
| *C09D 11/033* | (2014.01) | |
| *C09D 11/52* | (2014.01) | |
| *H05K 3/12* | (2006.01) | |
| *C01B 32/182* | (2017.01) | |
| *C01B 32/921* | (2017.01) | |
| *B41J 2/015* | (2006.01) | |
| *B82Y 40/00* | (2011.01) | |

(52) U.S. Cl.
CPC ............. *C09D 11/037* (2013.01); *B41J 2/015* (2013.01); *C01B 32/182* (2017.08); *C01B 32/921* (2017.08); *C09D 11/033* (2013.01); *C09D 11/52* (2013.01); *H05K 3/125* (2013.01); *H05K 3/1291* (2013.01); *B82Y 40/00* (2013.01); *C01P 2004/64* (2013.01)

(58) Field of Classification Search
CPC ................................................... C09D 11/037
See application file for complete search history.

(56) References Cited

U.S. PATENT DOCUMENTS

2017/0226362 A1*   8/2017   Fratello ............... C09D 11/037

* cited by examiner

*Primary Examiner* — William D Young
(74) *Attorney, Agent, or Firm* — Parsons Behle & Latimer

(57) ABSTRACT

Water-based nanoparticle inks may be formulated to be compatible with printed electronic direct-write methods. The water-based nanoparticle inks may include a functional material (nanoparticle) in combination with an appropriate solvent system. A method may include dispersing nanoparticles in a solvent and printing a circuit in an aerosol jet process or plasma jet process.

4 Claims, 5 Drawing Sheets

AQUEOUS BASED NANOPARTICLE INK

CROSS-REFERENCE TO RELATED APPLICATIONS

This application claims the benefit of and priority to, U.S. Provisional Patent Application No. 62/874,367, filed on Jul. 15, 2020, and entitled "Aqueous Based Nanoparticle Ink," the contents of which are hereby incorporated by reference herein in their entirety.

GOVERNMENT LICENSE RIGHTS

This invention was made with government support under grant nos. DE-AC07-051D14517 and DE-NE0000124 awarded by the Department of Energy. The government has certain rights in the invention.

FIELD OF THE DISCLOSURE

This disclosure is generally related to the field of conductive ink structures and, in particular, to aqueous based nanoparticle ink.

BACKGROUND

The versatility of direct write techniques such as aerosol jet printing (AJP) and ink jet printing (UP) has recently intersected with two-dimensional (2D) materials research in developing wearable sensors. Graphene and 2D transition metal nitrides, carbides and carbonitrides (MXenes) are of particular interest for wearable sensor applications due to their biocompatibility and multifunctional nature. However, in typical processes, these 2D materials may not be associated with inks that have sufficient properties (e.g., viscosity, concentrations) to enable effective AJP and/or UP. Because of these properties, typical inks may be contacted by biocompatible metals, e.g. platinum, in order to enable functional devices such as wearable and/or implantable electrochemical sensors and neural interfaces. Also, current direct write techniques with typical inks may be limited in their functional resolution. Other disadvantages may exist.

SUMMARY

In an embodiment, a method includes dispersing graphene into cyclohexanone/terpineol at a ratio of 85:15 to form a graphene ink. The method further includes printing a circuit in an aerosol jet process or a plasma jet process using the graphene ink.

In some embodiments, the method includes forming graphene sheets via solvent assisted exfoliation, where the dispersing the graphene into the cyclohexanone/terpineol is performed by dispersing the graphene sheets in the cyclohexanone/terpineol. In some embodiments, the graphene sheets have an average thickness of 1 nm to 31 nm. In some embodiments, the graphene sheets have crystal domains with lateral dimensions ranging from 50 nm to 200 nm. In some embodiments, the graphene ink has a graphene concentration of 3.5 mg/ml. In some embodiments, the method includes printing a graphene circuit trace using the graphene ink. In some embodiments, the method includes sintering the graphene circuit trace at 390 C for one hour.

In an embodiment, a method includes dispersing platinum nanopowders in a water and ethylene glycol mixture at a ratio of 17:30 to form a platinum ink. The method may further include printing a circuit in an aerosol jet process or a plasma jet process using the platinum ink.

In some embodiments, the platinum ink is 20 wt. % platinum. In some embodiments, the platinum nanopowders include platinum nanoparticles that have an average particle size between 5.5 nm and 9.1 nm. In some embodiments, the method includes printing a platinum circuit trace using the platinum ink. In some embodiments, the method includes sintering the platinum circuit trace at 450 C for 130 hours.

In an embodiment, a method includes dispersing $Ti_3C_2$ flakes in water at a concentration of 1 mg/mL to form a $Ti_3C_2$ ink. The method further includes printing a circuit in an aerosol jet process or a plasma jet process using the $Ti_3C_2$ ink.

In some embodiments, the method includes performing in situ high-frequency (HF) etching of a pre-cursor $Ti_3AlC_2$ material to form a colloidal suspension containing the $Ti_3C_2$ flakes. In some embodiments, the method includes sonicating the colloidal suspension with deionized water for 3 hours at 55 W.

Although various embodiments have been shown and described, the present disclosure is not so limited and will be understood to include all such modifications and variations as would be apparent to one skilled in the art.

Figure 1:
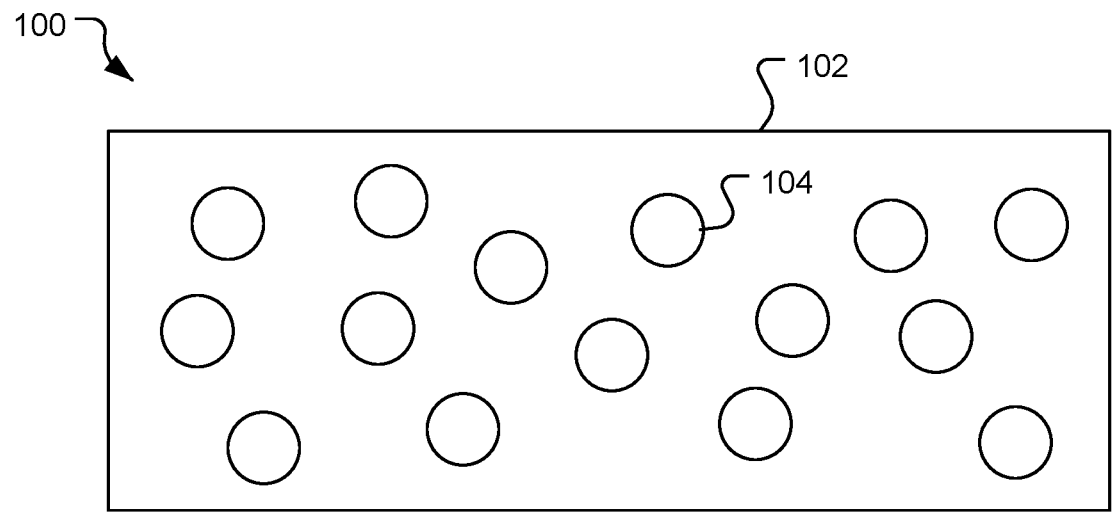
FIG. 1 is a diagram depicting an embodiment of a water-based nanoparticle ink.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure.

DETAILED DESCRIPTION

Described herein are water-based nanoparticle inks compatible with printed electronic direct-write methods such as an Aerosol Jet Printer for use with an ultrasonic atomizer (UA), and/or a Plasma Jet Printer. The disclosed inks may be composed of a functional material (nanoparticle) in combination with an appropriate solvent system consisting of a solvent to disperse the material and additives which serve to increase the stability of the dispersion, to enhance adhesion. The disclosed ink may be applied in additively manufacture electronic components, sensors, and/or electrochemical components. Furthermore, the ink may be deposited on and compatible with substrates having polar surfaces. A sintering process may remove the solvent system to produce functional components.

Referring to FIG. 1, a water-based nanoparticle ink 100 is depicted. The water-based nanoparticle ink 100 may be a suspension including a water-based solvent 102 with nanoparticles 104 suspended therein. As an example, the ink 100 may be a graphene ink and may include graphene particles 104 dispersed in cyclohexanone/terpineol 102 at a ratio of 85:15. In another example, the ink 100 may be a platinum ink and may include platinum nanopowders 104 dispersed a water and ethylene glycol mixture 102 at a ratio of 17:30. In another embodiment, a titanium carbide MXene ($Ti_3C_2$) ink 100 may include $Ti_3C_2$ flakes 104 dispersed in water 102 at a concentration of 1 mg/mL. The ratios and concentrations described herein may enable the inks to be used with Aerosol Jet Printing methods, Plasma Jet Printing methods, and/or other types of direct write methods for which particle sizes within the inks range from 1-500 nm, viscosities of the inks range from 1-10 cP, and loading concentrations of the inks range from 1-70%.

Figure 2:
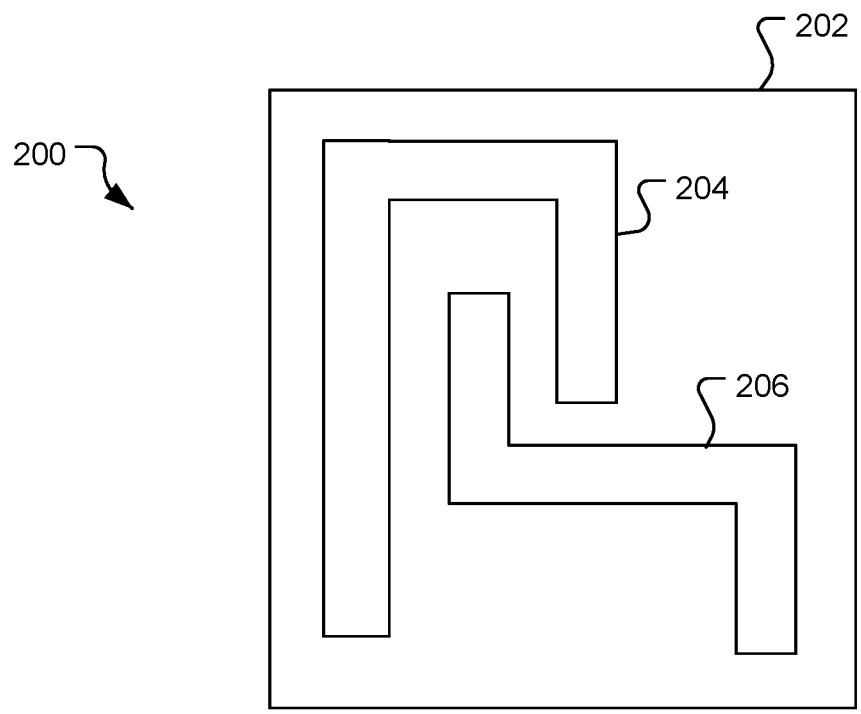
FIG. 2 is a diagram of an electrical circuit printed using an embodiment of a water-based nanoparticle ink.

Referring to FIG. 2, an electronic device 200 may include a substrate 202. One or more electrical traces may be formed on the substrate 202. For example, a first trace 204 and a second trace 206 may be formed. The traces 204, 206 may be formed through a direct print method, such as AJP and/or IJP. Further, the traces 204, 206 may be formed from the water-based nanoparticle ink 100 of FIG. 1. After they are printed, the traces 204, 206 may be sintered to remove the solvent from the nanoparticle ink 100. This may result in increased conductivity of the traces 204, 206. Although two traces 204, 206 are depicted, the electronic device 200 may include more or fewer than two. Further, the shapes and paths of the traces 204, 206 may differ form the depiction of FIG. 2 depending on a particular application. FIG. 2 is presented for exemplary purposes and, in practice, the electronic device 200 may differ from the structure shown.

The electronic device 200 may include a wearable and/or implantable electrochemical sensor, a neural interface, another type of direct printed sensing device, or combinations thereof. Conductive traces 204, 206 may be direct printed without including contacts, such as platinum, that may have been applied to the substrate 202 by means other than direct printing methods. This may result in better adaptability of the electronic device 200 to conforming surfaces, wearable devices, and/or biological surfaces.

Figure 3:
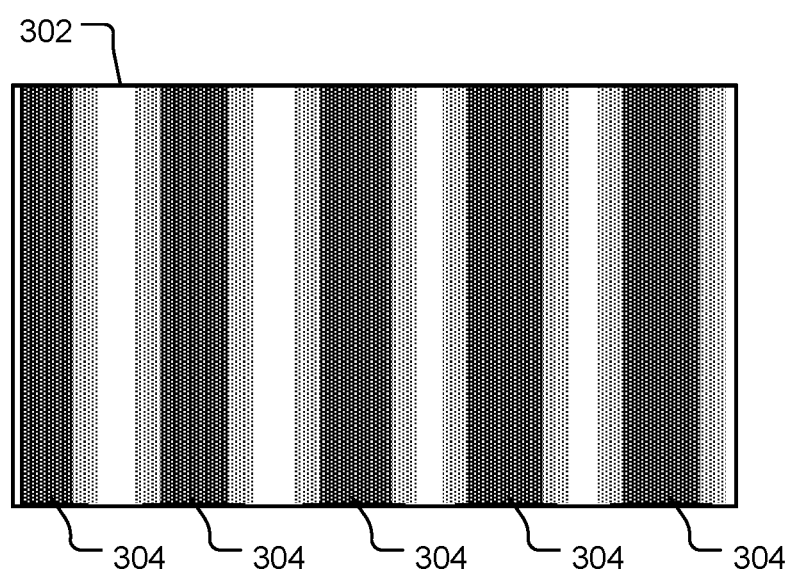
FIG. 3 is a diagram depicting printed nanoparticle ink traces.

Referring to FIG. 3, a diagram depicting printed nanoparticle ink traces 304 is depicted. The nanoparticle ink traces 304 may be printed on a substrate 302. FIG. 3 may highlight the structural benefits of the nanoparticle inks described herein. As shown in FIG. 3, the ink traces 304 may include some overspray as a result of an aerosol jet process and/or a plasma jet process. However, the ink traces 304 may omit inconsistencies such as juts and waves. Benefits of aerosol jet processes and/or plasma jet processes are that patterns may be printed at very high resolutions, but at lower costs, than other application methods. In addition, aerosol jet printing may be used on a wide range of substrates for multiple applications. The nanoparticles and solvents described herein may be robust enough to support the processes. For example, they may be resistant to flaming when used in a plasma jet process. Other benefits may exist.

Figure 4:
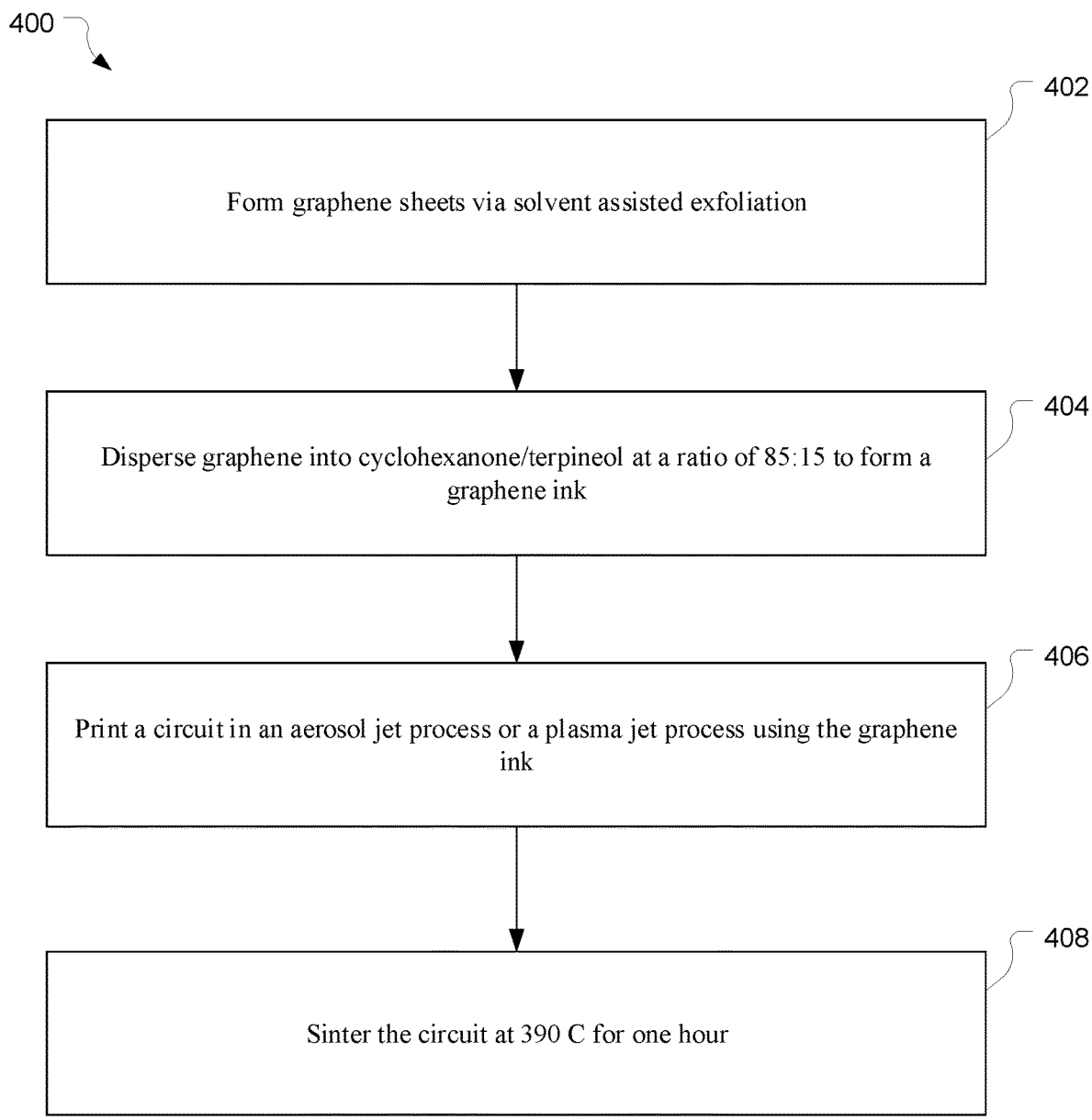
FIG. 4 is a flow diagram depicting a water-based nanoparticle ink method.

Referring to FIG. 4, a water-based nanoparticle ink method 400 is depicted. The method 400 may include forming graphene sheets via solvent assisted exfoliation, at 402. The method 400 may further include dispersing graphene into cyclohexanone/terpineol at a ratio of 85:15 to form a graphene ink, at 404. The method 400 may also include printing a circuit in an aerosol jet process or a plasma jet process using the graphene ink, at 406. The method 400 may include sintering the circuit at 390 C for one hour, at 410.

A benefit of the method 400 is that by including graphene into cyclohexanone/terpineol at a ratio of 85:15, a graphene ink that can support an aerosol jet process and/or a plasma jet process may be formed. Other benefits may exist.

Figure 5:
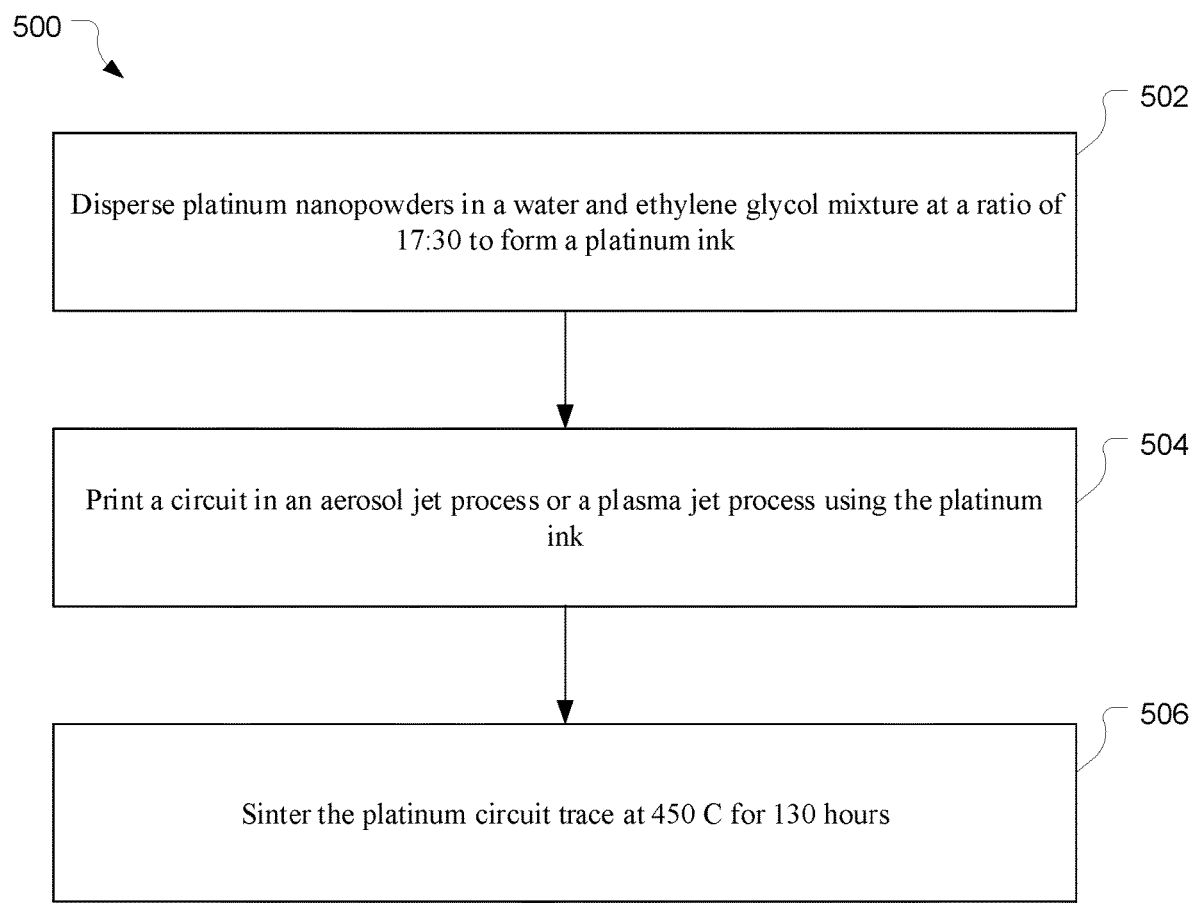
FIG. 5 is a flow diagram depicting a water-based nanoparticle ink method.

Referring to FIG. 5, a water-based nanoparticle ink method 500 is depicted. The method 500 may include dispersing platinum nanopowders in a water and ethylene glycol mixture at a ratio of 17:30 to form a platinum ink, at 502. The method 500 may further include printing a circuit in an aerosol jet process or a plasma jet process using the platinum ink, at 504. The method 500 may also include sintering the platinum circuit trace at 450 C for 130 hours, at 506.

A benefit of the method 500 is that by including platinum nanopowders in a water and ethylene glycol mixture at a ratio of 17:30, a platinum ink that can support an aerosol jet process and/or a plasma jet process may be formed. Other benefits may exist.

Figure 6:
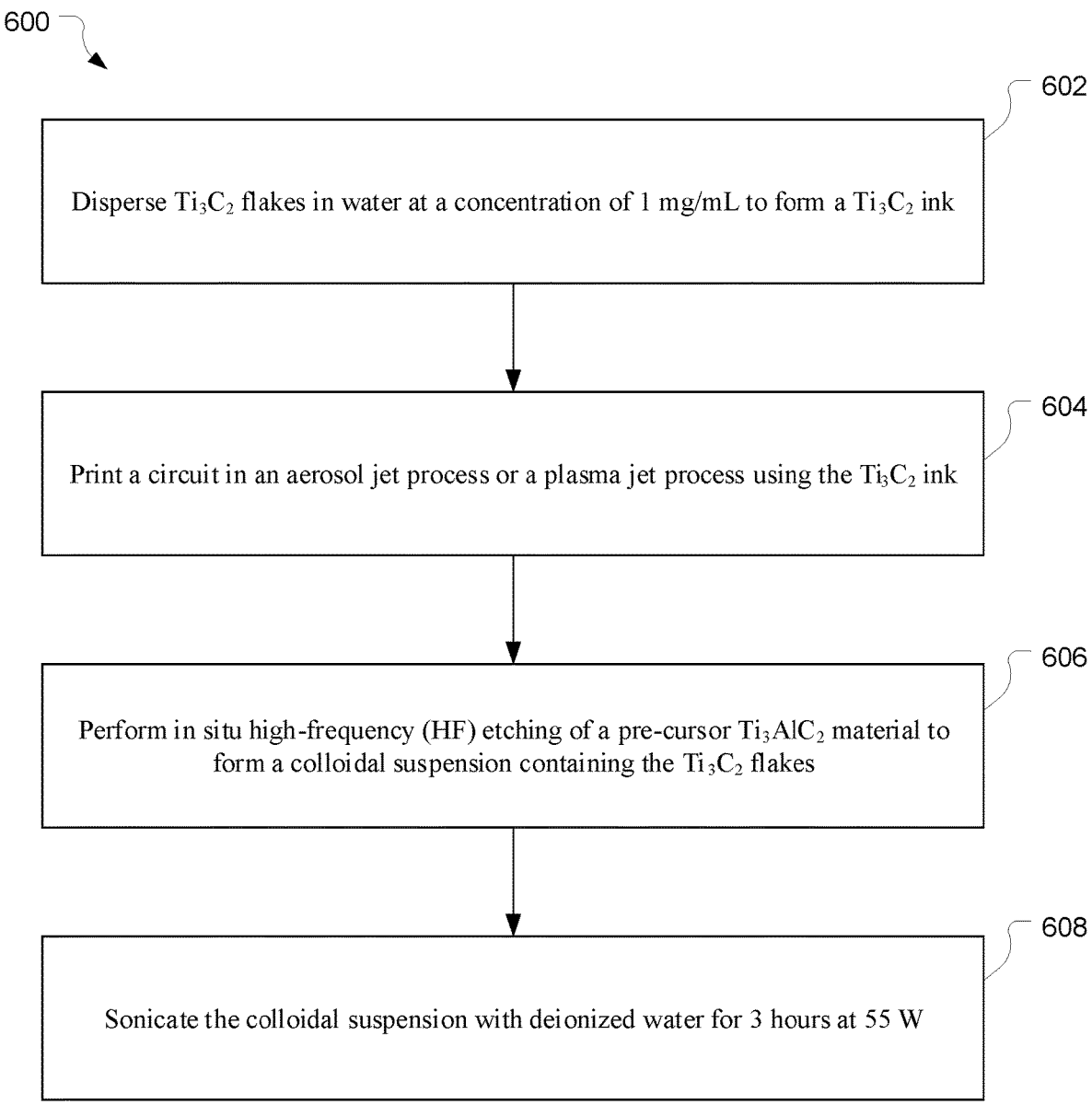
FIG. 6 is a flow diagram depicting a water-based nanoparticle ink method.

Referring to FIG. 6, a water-based nanoparticle ink method 600 is depicted. The method 600 may include dispersing $Ti_3C_2$ flakes in water at a concentration of 1 mg/mL to form a $Ti_3C_2$ ink, at 602. The method 600 may further include printing a circuit in an aerosol jet process or a plasma jet process using the $Ti_3C_2$ ink, at 604. The method 600 may also include performing in situ high-frequency (HF) etching of a pre-cursor $Ti_3AlC_2$ material to form a colloidal suspension containing the $Ti_3C_2$ flakes, at 606. The method 600 may include sonicating the colloidal suspension with deionized water for 3 hours at 55 W, at 608.

A benefit of the method 600 is that by including $Ti_3C_2$ flakes in water at a concentration of 1 mg/mL, a $Ti_3C_2$ ink that can support an aerosol jet process and/or a plasma jet process may be formed. Other benefits may exist.

EXAMPLES

In this disclosure, we report the printing of 2D materials, graphene, titanium carbide Mxenes ($Ti_3C_2$), and platinum nanoparticles via AJP and IJP. Ink characterization was performed with atomic force microscopy, scanning and transmission electron microscopy (SEM and TEM), DLS and Raman spectroscopy. Graphene sheets were obtained via solvent assisted exfoliation and then dispersed in 85:15 cyclohexanone/terpineol to formulate graphene inks at a concentration of 3.5 mg/ml. Graphene sheets exhibited an average thickness of 16 nm +/−15 nm and crystal domains with lateral dimensions ranging from ~50 nm to 200 nm.

Platinum ink (20 wt. %) was formulated with the dispersion of platinum nanopowders and 70:30 water/ethylene glycol mix. Dispersed platinum nanoparticles exhibited an average particle size of 7.8 nm +/−2.3 nm.

Finally, an AJP compatible multi-layered MXene ink was obtained by in situ HF etching of the pre-cursor Ti3AlC2 MAX phase. The obtained colloidal suspension containing 2D MXene flakes was sonicated with deionized water for 3 hours at 55 W. The resultant ink had a concentration of 1 mg/mL and an average flake size of 100 nm +/−10 nm, as confirmed by dynamic light scattering (DLS) measurements.

Platinum, graphene and $Ti_3C_2$ inks have demonstrated good compatibility with an Optomec Aerosol Jet 200 and a Dimatix 2850 materials inkjet printer, while platinum and graphene have shown additional compatibility with IJP. For good electrical conductivity graphene was sintered at 390 C for one hour and platinum was sintered at 450 C for 130 hours, while MXenesshowed good conductivity without sintering.

Optical microscopy, SEM, stylus profilometry, and two/four-point resistance measurements were used to examine the quality of the printed MXene and platinum structures. Initial printing with MXenes resulted in feature heights ranging from ~620 nm to 4.80 µm, depending on the number of print passes denoted as N. Our most uniform prints were N=15 and N=20 having a height of 2.50 µm +/−0.10 µm and 3.50 µm +/−0.10 respectively.

Electrical resistance varied between R=568 kΩ and R=60 kΩ for N=5 and N=25 respectively. Platinum exhibited good electrical conductivity as R=70Ω for N=10, having a height of 3 µm and a feature width of ~50 µm. Furthermore, the electrochemical properties of fully inkjet-printed graphene electrodes on a flexible polyimide substrate for pH and electrolyte sensing were investigated. Printed electrodes consisted of a printed 1×1 cm graphene square with a total of 17 layers with printed silver contact pads and a SU-8 as a passivation layer.

Electrochemical activity of inkjet-printed graphene electrodes was demonstrated with both cyclic voltammetry (CV) and differential pulse voltammetry (DPV) measurements in a room temperature 10 mM ferricyanide aqueous solution (1 M KCl supporting electrolyte). Ag/AgCl and platinum electrodes were used as the reference and counter electrode, respectively. Additionally, pH sensing capabilities were investigated by measuring the potentiometric response of polyaniline coated graphene electrodes over three different pH values (4, 7 and 10). The response of printed and flexible graphene electrodes was comparable to that of a conventional glass electrode.

AJP compatible $Ti_3C_2$ MXene inks along with AJP and IJP compatible platinum and graphene inks are disclosed herein. Printing of these biocompatible materials may support the fabrication of nanomaterial based flexible hybrid electronics such as biosensors for electrochemical sensing of a broad spectrum of biomarkers, and also neural interface systems. Further, our results provide new fundamental insights on role of structure-property-performance correlations in printed graphene electrodes for electrochemical sensing. The combination of our works highlight the significant potential of novel material inks for additively manufactured wearable sensors Although various embodiments have been shown and described, the present disclosure is not so limited and will be understood to include all such modifications and variations as would be apparent to one skilled in the art.

What is claimed is:

1. A method comprising:
   dispersing platinum nanopowders in a water and ethylene glycol mixture at a ratio of 17:30 to form a platinum ink, wherein the platinum ink is 20 wt. % platinum; and
   printing a circuit in an aerosol jet process or a plasma jet process using the platinum ink.

2. The method of claim 1, wherein the platinum nanopowders include platinum nanoparticles that have an average particle size between 5.5 nm and 9.1 nm.

3. The method of claim 1, further comprising:
   printing a platinum circuit trace using the platinum ink.

4. The method of claim 3, further comprising:
   sintering the platinum circuit trace at 450 C for 130 hours.

* * * * *